United States Patent
Alvarez-Gomariz et al.

(10) Patent No.: US 7,549,142 B2
(45) Date of Patent: Jun. 16, 2009

(54) METHOD AND DEVICE FOR CHECKING LITHOGRAPHY DATA

(75) Inventors: Husayn Alvarez-Gomariz, Meridian, ID (US); John R. C. Futrell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 217 days.

(21) Appl. No.: 11/423,075

(22) Filed: Jun. 8, 2006

(65) Prior Publication Data

US 2006/0235663 A1  Oct. 19, 2006

Related U.S. Application Data

(62) Division of application No. 10/609,153, filed on Jun. 24, 2003, now Pat. No. 7,096,452.

(51) Int. Cl.
| | |
|---|---|
| *G06F 17/50* | (2006.01) |
| *G06F 17/10* | (2006.01) |
| *G06F 19/00* | (2006.01) |
| *G03F 1/00* | (2006.01) |
| *G21K 5/00* | (2006.01) |
| *G06T 17/00* | (2006.01) |

(52) U.S. Cl. .................. 716/21; 716/4; 716/10; 700/97; 700/120; 700/121; 703/2; 703/14; 430/5; 378/35; 715/245; 715/763; 715/964; 345/420; 345/619; 345/423; 345/581

(58) Field of Classification Search .......... 716/4, 716/10, 21; 703/1, 2, 14; 700/97, 120, 121; 430/5; 378/35; 715/245, 763, 964; 345/420, 345/619, 423, 581
See application file for complete search history.

(56) References Cited

U.S. PATENT DOCUMENTS

| | | | |
|---|---|---|---|
| 5,504,793 A | | 4/1996 | Chen |
| 5,625,764 A | * | 4/1997 | Tsujimoto et al. ........... 345/640 |
| 5,715,385 A | * | 2/1998 | Stearns et al. ............... 345/648 |
| 5,946,479 A | * | 8/1999 | Sakaguchi et al. ............ 716/20 |
| 6,051,027 A | * | 4/2000 | Kapur et al. ................... 703/5 |
| 6,127,071 A | | 10/2000 | Lu |
| 6,226,560 B1 | | 5/2001 | Hama et al. |
| 6,543,045 B2 | | 4/2003 | Ludwig et al. |
| 6,606,739 B2 | * | 8/2003 | Kanatake et al. .............. 716/21 |
| 6,625,792 B1 | | 9/2003 | Yamasaki |
| 6,721,694 B1 | * | 4/2004 | Lambrecht et al. ............. 703/2 |
| 6,811,933 B2 | | 11/2004 | Levenson |
| 6,892,365 B2 | | 5/2005 | Culp et al. |
| 6,934,928 B2 | | 8/2005 | Juengling |
| 6,957,414 B2 | | 10/2005 | Ludwig et al. |

(Continued)

FOREIGN PATENT DOCUMENTS

WO   WO-0209152 A2   1/2002

*Primary Examiner*—Phallaka Kik
(74) *Attorney, Agent, or Firm*—Schwegman, Lundberg & Woessner, P.A.

(57) ABSTRACT

Devices and methods are provided that include advantages such as the ability to identify sizes, shapes and locations of frequently unwanted additional features that occur as a result of photolithographic interference. The additional feature information is obtained through use of simulation methods with reduced processing time or solving a system of equations. This allows a user to quickly find information about additional feature printing before the features are printed, and before the reticle is made.

20 Claims, 15 Drawing Sheets

U.S. PATENT DOCUMENTS

| | | |
|---|---|---|
| 6,981,241 B2 | 12/2005 | Ludwig et al. |
| 6,985,161 B1 * | 1/2006 | Politis .................... 345/629 |
| 7,096,452 B2 | 8/2006 | Alvarez-Gomariz et al. |
| 7,376,266 B2 * | 5/2008 | Simard et al. ............ 382/166 |
| 2001/0055019 A1 * | 12/2001 | Sowizral et al. ........... 345/441 |
| 2002/0039691 A1 | 4/2002 | Czech et al. |
| 2002/0046392 A1 | 4/2002 | Ludwig et al. |
| 2002/0062206 A1 | 5/2002 | Liebchen |
| 2002/0177050 A1 | 11/2002 | Tanaka |
| 2002/0182895 A1 | 12/2002 | Butschke et al. |
| 2003/0118250 A1 * | 6/2003 | Tlaskal et al. ............ 382/284 |
| 2003/0140331 A1 | 7/2003 | Ludwig et al. |
| 2003/0148195 A1 | 8/2003 | Takeuchi |
| 2003/0229882 A1 | 12/2003 | Ludwig et al. |
| 2004/0044980 A1 | 3/2004 | Juengling |
| 2004/0209170 A1 | 10/2004 | Broeke et al. |
| 2004/0268291 A1 | 12/2004 | Alvarez-Gomariz et al. |
| 2005/0034092 A1 | 2/2005 | Juengling |
| 2005/0048381 A1 | 3/2005 | Takeuchi |
| 2005/0051873 A1 | 3/2005 | Jin |
| 2005/0278685 A1 | 12/2005 | Granik et al. |
| 2006/0234140 A1 | 10/2006 | Alvarez et al. |
| 2006/0277522 A1 | 12/2006 | Shi et al. |

* cited by examiner

METHOD AND DEVICE FOR CHECKING LITHOGRAPHY DATA

RELATED APPLICATIONS

This application is a Divisional of U.S. application Ser. No. 10/609,153, filed on Jun. 24, 2003, now U.S. Pat. No. 7,096,452 which is incorporated herein by reference.

TECHNICAL FIELD

The invention relates to lithography fabrication methods and devices. Specifically, the invention relates to lithography of patterns on a surface of a semiconductor wafer.

BACKGROUND

Lithography is a fabrication technique that is employed for use in a number of industries, including the semiconductor processing industry. Specifically, photolithography uses an energy source such as ultraviolet (UV) light, x-ray wavelength, other wavelengths of radiation, etc. to expose selected regions of a surface. In one common technique, the surface includes a semiconductor wafer such as silicon that has been coated with a resist material. The resist material properties are locally changed when exposed to the energy source, which allows selected regions of the resist material to remain, while unwanted regions of the resist material are removed. In one method, the exposed regions of the resist are removed, in another method, the non-exposed regions of the resist material are removed.

In one method of photolithography, a pattern of features is created on a reticle, and the pattern on the reticle is focused onto a semiconductor surface using optics that adjust the scale of the pattern on the reticle to fit the semiconductor surface. In the semiconductor industry, there is an ever present pressure to reduce the size of features in the pattern to increase the density of patterned features packed into the same semiconductor surface area. In one example industry, manufacturers of random access memory chips such as dynamic random access memory (DRAM) strive to put more storage cells onto a chip.

As feature size decreases, photolithography of smaller and smaller features becomes more and more difficult. One problem that becomes increasingly significant, although still present on larger scales, is the optical interactions of the energy source, such as UV light or x-ray radiation. Because energy sources are wavelike in behaviour, constructive interference, destructive interference, and other optical interaction effects cause some reticle apertures to produce printed features that are not shaped as intended, or include unwanted features in addition to the desired features.

What is needed is a method and device that improves photolithography of small features and other features that produce unwanted results. Semiconductor manufacturing is also very commercially competitive. What is also needed is a method and device that reduces the manufacturing time and/or manufacturing cost.

DETAILED DESCRIPTION

Figure 1:
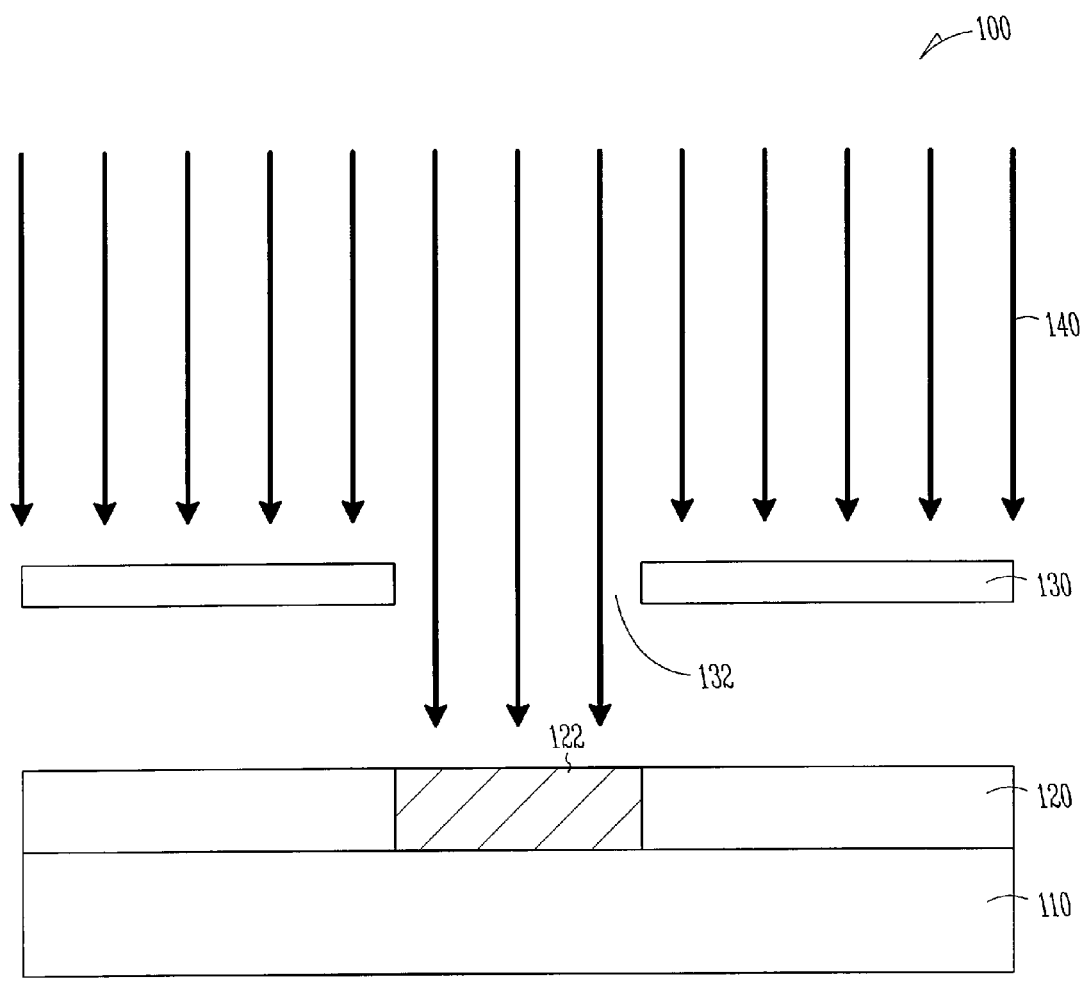
FIG. 1 shows a reticle and substrate.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The terms wafer and substrate used in the following description include any structure having an exposed surface with which to form a device or integrated circuit (IC) structure. The term substrate is understood to include semiconductor wafers. The term substrate is also used to refer to semiconductor structures during processing, and may include other layers, such as silicon-on-insulator (SOI), etc. that have been fabricated thereupon.

In selected embodiments, as described below, the creation and modification of patterns of elements is performed within a computing environment such as a computer aided design (CAD) system. Acceptable graphical software programs include, but are not limited to HERCULES, DF2 as provided by CADENCE, AUTOCAD, etc. In one embodiment, the software program includes a hierarchical structure allowing for organization of repeating patterns of features. Unless a printed pattern is specifically referred to, terms such as patterns, features, etc. refer to an organization of data that can be graphically represented as a pattern, feature, etc. The data can be stored on a computer executable medium such as a magnetic medium, an optical medium, a computer memory, hard drive, etc.

In one embodiment, a pattern of features is formed on a reticle and the pattern is then transferred to a substrate using photolithography. In one embodiment the pattern of features includes semiconductor device component features including, but not limited to source/drain regions, transistor gates, trace lines, source/drain contacts, vias, capacitor plates, etc. FIG. 1 shows a photolithography system 100. The system 100 includes a substrate 110. In one embodiment, the substrate 110 includes a semiconductor substrate, such as a silicon wafer. Although a semiconductor substrate is discussed for illustration, other working surfaces utilizing photolithography are within the scope of the invention.

A resist layer 120 is located over a surface of the substrate 110. A reticle 130 is shown with an aperture 132, and is spaced apart from the resist layer 120 by a focal length. The reticle 130 is shown in a simplified form with an energy blocking region and an aperture 132. In one embodiment, the reticle 130 further includes a layer that is substantially transparent, such as a glass. In one embodiment, the reticle 130 further includes an attenuated portion adapted to block a portion of an energy source 140 or to phase shift a portion of the energy source 140. The term "transparent" and other associated optical terms in the present specification refers to optical properties associated with the given energy source 140. Possible energy sources include, but are not limited to UV radiation, and x-ray radiation. One source of suitable radiation is from a laser light source.

The energy source 140 is directed towards the resist layer 120, with a portion of the energy source 140 being blocked by the reticle 130. A portion of the energy source 140 is shown passing through the aperture 132 in the reticle 130 and contacting the resist layer 120 in a selected region 122. The selected region 122 interacts with the energy source 140 to selectively alter the resist material properties. Two possible interactions include a curing of the resist material and a weakening of the resist material. In one possibility, the selected region 122 remains while the remaining portion of the resist layer 120 is removed. In another possibility, the selected region 122 is removed while the remaining portion of the resist layer remains.

Figure 2A:
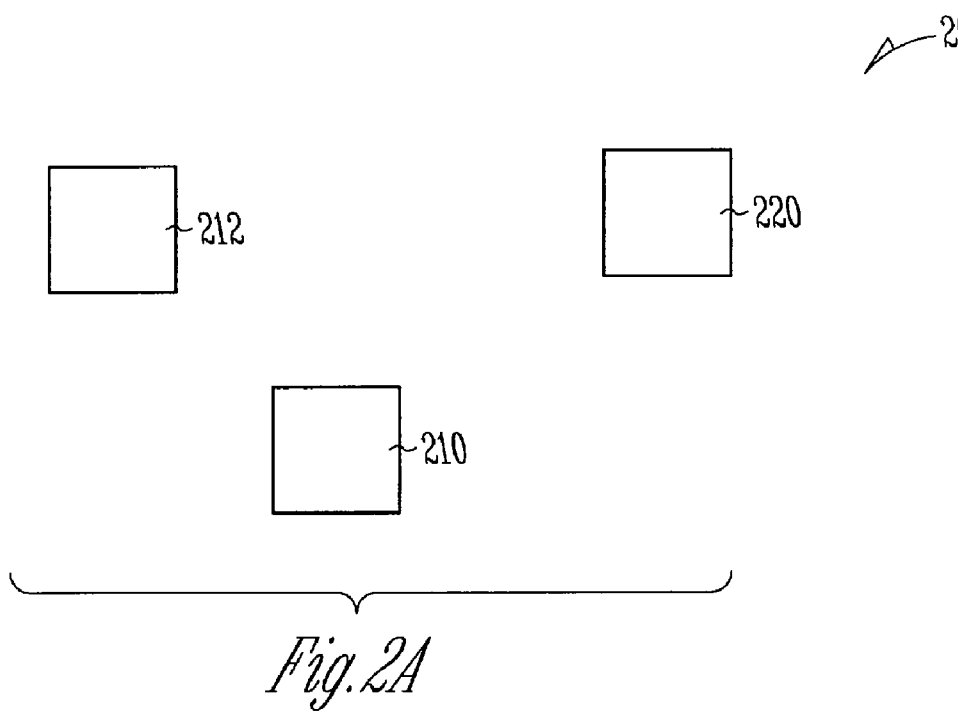
FIG. 2A shows a reticle pattern of features.

FIG. 2A shows a reticle pattern of features 200 shown with features geometries as shaped on a reticle or similar optical tool. The reticle pattern of features 200 includes a first feature 210, a second feature 212 and a third feature 220. The first and second features 210, 212 are located in close proximity to each other, while the third feature 220 is located a distance from the first and second features 210, 212 so that the third feature 220 has substantially no optical interaction with either the first feature 210 or the second feature 212. The third feature 220 therefore functions substantially as a solo feature.

Figure 2B:
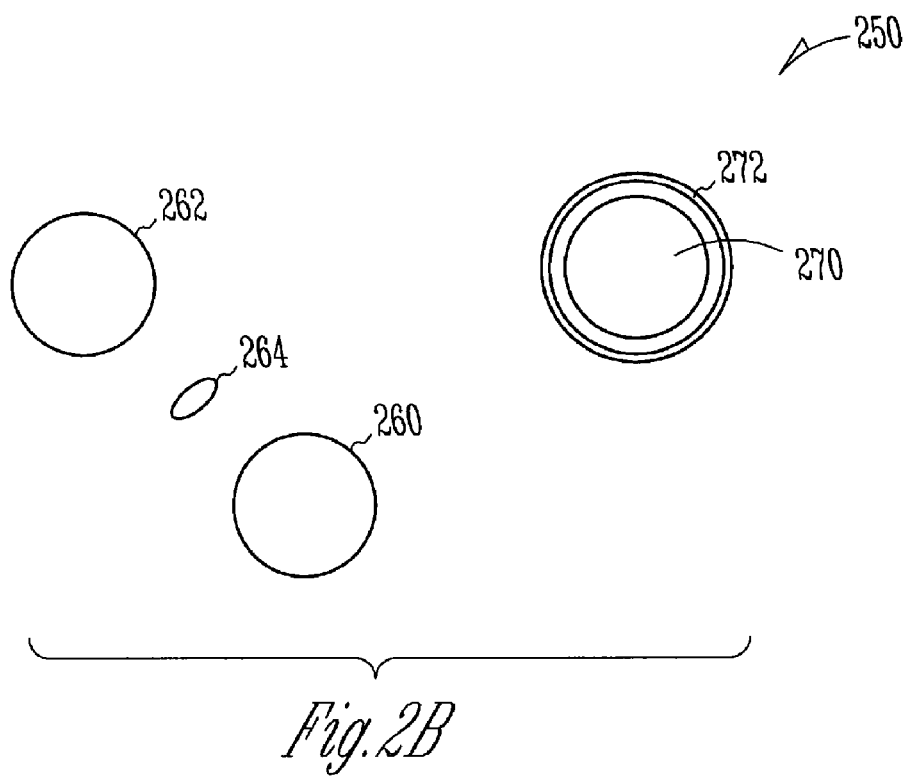
FIG. 2B shows a printed pattern of features from the pattern of FIG. 2A.

FIG. 2B shows a printed pattern of features 250 created by the reticle pattern of features 200 as shown in FIG. 2A. Due to optical interactions in small scale printing, a reticle feature of a square prints as a more rounded feature of a circle as illustrated in FIG. 2B. The geometry of the printed features in FIG. 2B is meant as an illustration, and is not exact in shape or dimension. Printed feature 260 is formed from the first feature 210, and printed feature 262 is formed from the second feature 212. Likewise, printed feature 270 is formed from the third feature 220.

Also shown in FIG. 2B are additional features created by optical interactions during the printing process. An additional feature 264 is shown formed between features 260 and 262. In one embodiment, the close spacing of the first feature 210 and the second feature 212 lead to optical interactions that produce the additional feature 264. Regarding the printed feature 270, under certain conditions such as a specific wavelength and reticle feature size, a solo feature also produces additional features. An illustration of an additional feature 272 is shown in FIG. 2B in relation to the printed feature 270.

Although a geometry of a ring is shown associated with additional feature 272, other possible geometries or combinations of additional features may be created. Likewise, although an ellipse shape is illustrated for the additional feature 264, other geometries of additional features are possible depending on variables in the photolithography system such as wavelength and reticle feature geometry.

In one embodiment, optical simulation software is utilized to predict where additional features will form in a printing operation. One example of optical simulation software uses input variables such as wavelength of the energy source, the focal length, the geometry information of the reticle pattern of features, etc. In one embodiment, the optical simulation software calculates interactions in three dimensions. Calculation in two dimensions and four dimensions are included in other embodiments. Wave interactions that produce features through constructive or destructive interference are predicted using mathematical analyses, thus enabling a prediction of size, shape, and location on the substrate of additional features such as those described in FIG. 2B. Optical simulation software is useful in the photolithography process because it allows checking of a reticle design before the reticle is actually made. Elimination or modification of additional features can therefore be accomplished using the information provided by the optical simulation software.

One drawback to optical simulation software is that it is very computationally intensive. Simulation of one reticle can take up to several hours. In one embodiment of the invention, certain regions of a proposed reticle design are checked. By checking only a portion of the proposed reticle design, a significant amount of processor time can be saved. In one embodiment, the regions that are chosen for checking by the optical simulation software are selected based on their likelihood to include additional features. The optical simulation software is therefore able to perform detailed computations on a smaller total area of the proposed reticle, resulting in an accurate prediction of size, shape and location of additional features. By selecting only likely regions of the proposed reticle, a significantly reduction in time is realized in contrast to performing optical simulation over an entire proposed reticle area. In one embodiment, processor time is reduced by approximately 90 percent. Methods for selection of regions likely to include additional features are described below.

Figure 3A:
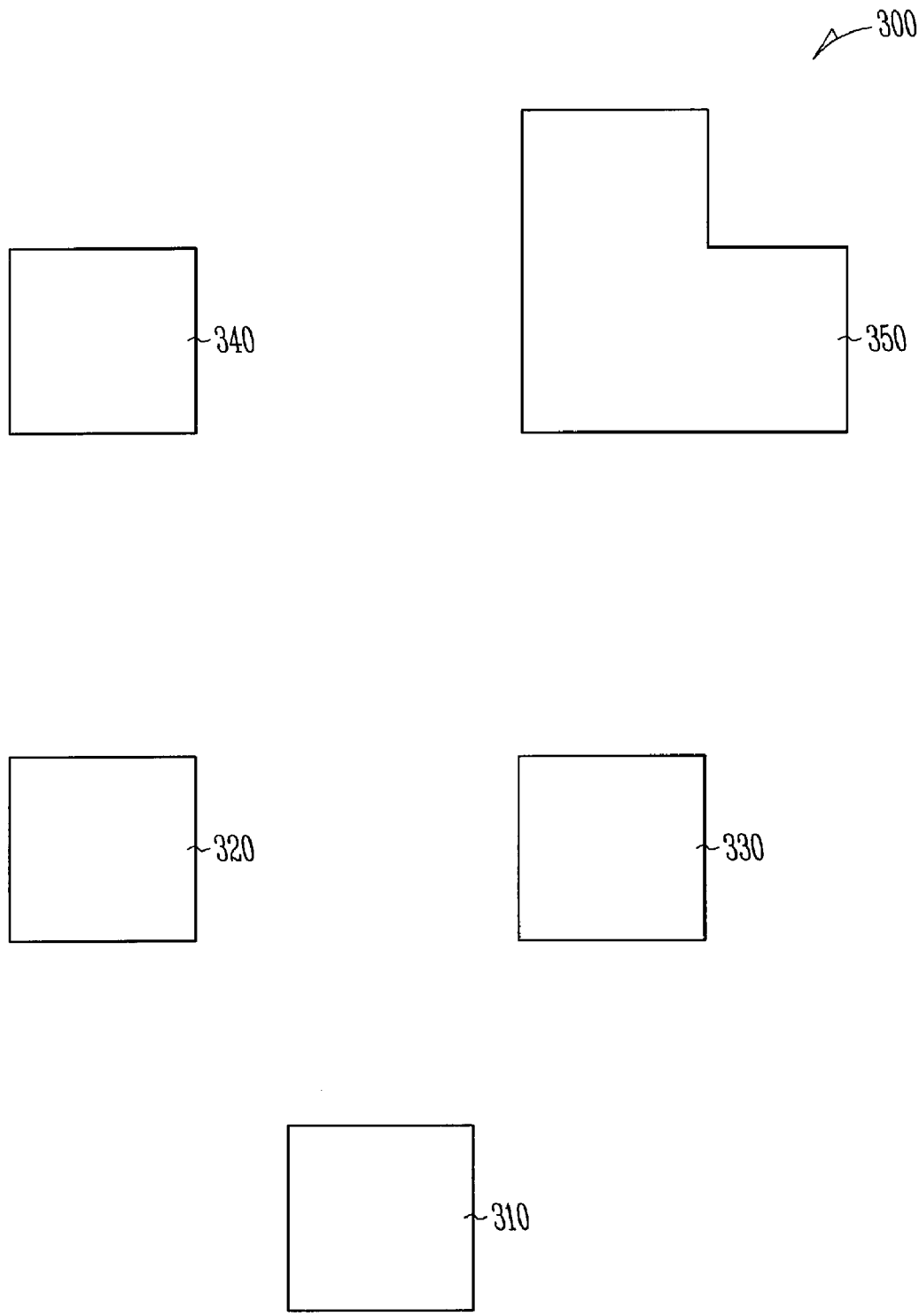
FIG. 3A shows a pattern of features according to an embodiment of the invention.

FIG. 3A shows a reticle pattern of features 300. The reticle pattern of features shown in FIG. 3A is not yet printed on a substrate, and is not yet formed into a reticle. The reticle pattern 300 is an organization of data in a computer readable medium. The reticle pattern 300 includes a first feature 310, a second feature 320, a third feature 330, a fourth feature 340, and a fifth feature 350.

Figure 3B:
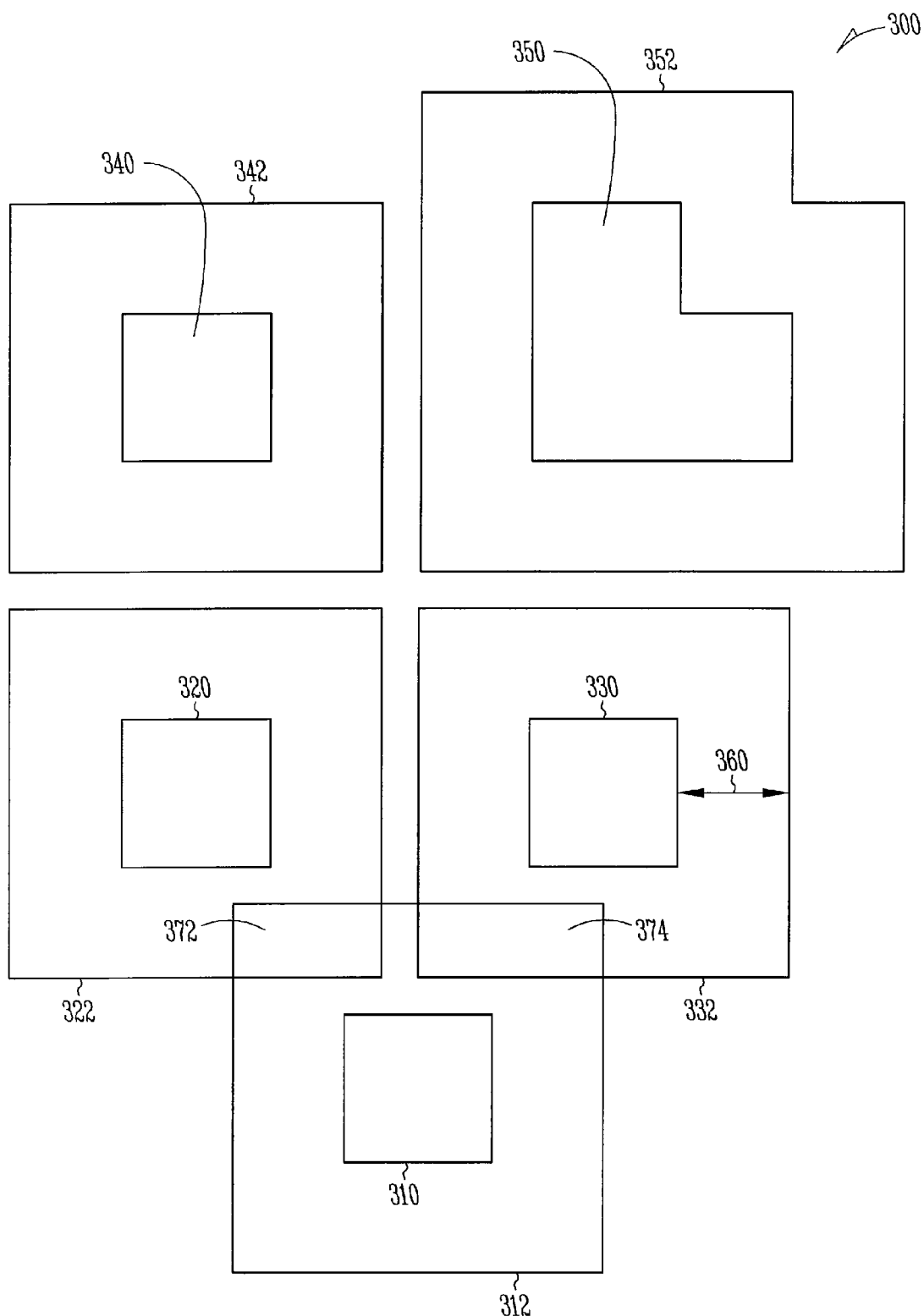
FIG. 3B shows additional regions identified according to an embodiment of the invention.

In FIG. 3B, a new region is defined around each of the features of the reticle pattern 300. In one embodiment, the new regions are defined by sizing up each of the features of the reticle pattern 300 by a given distance 360. Although sized up regions are shown with a substantially constant sized up distance, other embodiments may include new regions that are sized up by varying distances. A sized up outline in one embodiment includes two or more sized up distances used for different selected sides of pattern features. A sized up outline in one embodiment includes a curved outline spaced apart from selected sides of pattern features by a distance determined by an equation. A sized up outline in one embodiment includes an outline that is determined by a feature other than the location of a side of a pattern feature, for example a centroid of a pattern feature. As shown in FIG. 3B, sized up region 312 is formed around the first feature 310. Likewise, sized up region 322 is formed around the second feature 320, sized up region 332 is formed around the third feature 330, sized up region 342 is formed around the fourth feature 340, and sized up region 352 is formed around the fifth feature 350.

In one embodiment, the given distance 360 is defined as an optical ambit of the given photolithographic system. The optical ambit is affected by photolithography variables such as wavelength of the selected energy source, the focal length, etc. In one embodiment, the optical ambit is further defined as the distance beyond which no optical interactions are observed between features.

FIG. 3B shows a number of areas where the sized up regions as described above overlap. Area 374 is defined by an overlap of region 312 and region 322. Likewise, area 372 is defined by an overlap of region 312 and region 332.

Figure 3C:
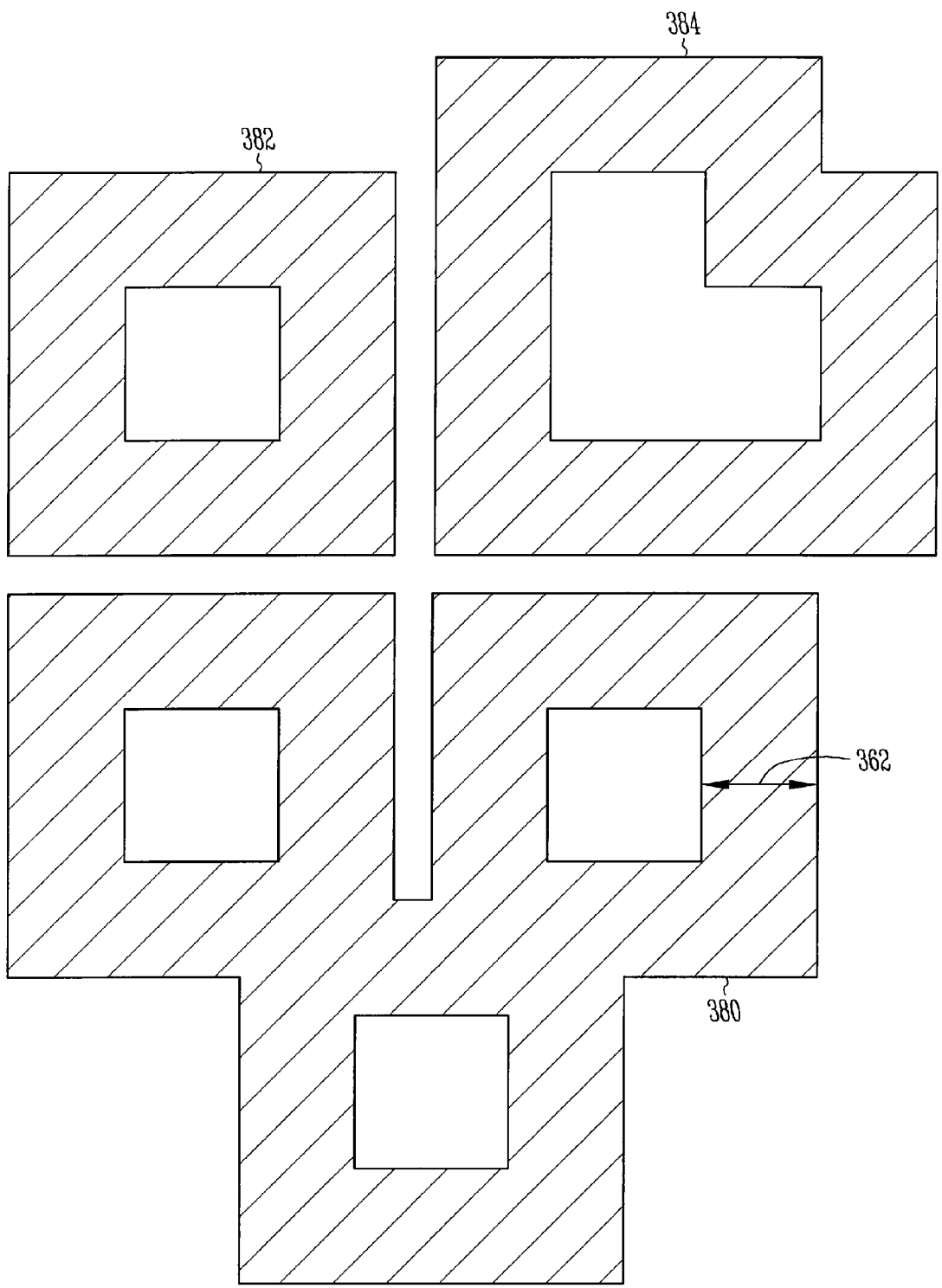
FIG. 3C shows a number of regions according to an embodiment of the invention.

FIG. 3C shows a number of regions selected for checking by optical simulation software. A first region 380, a second region 382, and a third region 384 are selected in FIG. 3C. The regions are shown with shading to indicate the area for optical simulation. The first region 380 is defined by sized up region 312, sized up region 322, and sized up region 332 as shown in FIG. 3B. The first region 380 in FIG. 3C includes all areas around the first feature 310, the second feature 320, and the third feature 330, sized up by the given distance 362. In one embodiment, the first region 380 does not include the area defined by the features themselves as shown by the shading in FIG. 3C. The first region 380 is therefore made up of a number of ring-like regions. The ring-like regions have a smaller area than the entire proposed reticle area, and the subtraction of the feature itself further reduces the area for optical simulation. In the present descriptions, the term ring-like includes any shape including complex shapes where the subtraction of at least one feature leaves at least one gap within a region.

The second region 382 also shows a ring-like region with the area of the fourth feature 340 subtracted from within the sized up region 342. In one embodiment, the second region 382 is defined by sizing up the fourth feature 340 by the given distance 362. The third region 384 also shows a ring-like region, although the shape of the third region is more complex than the shape of the second region 382. The third region 384 is defined with the area of the fifth feature 350 subtracted from within the sized up region 352. In one embodiment, the third region 384 is defined by sizing up the fifth feature 350 by the given distance 362.

Figure 3D:
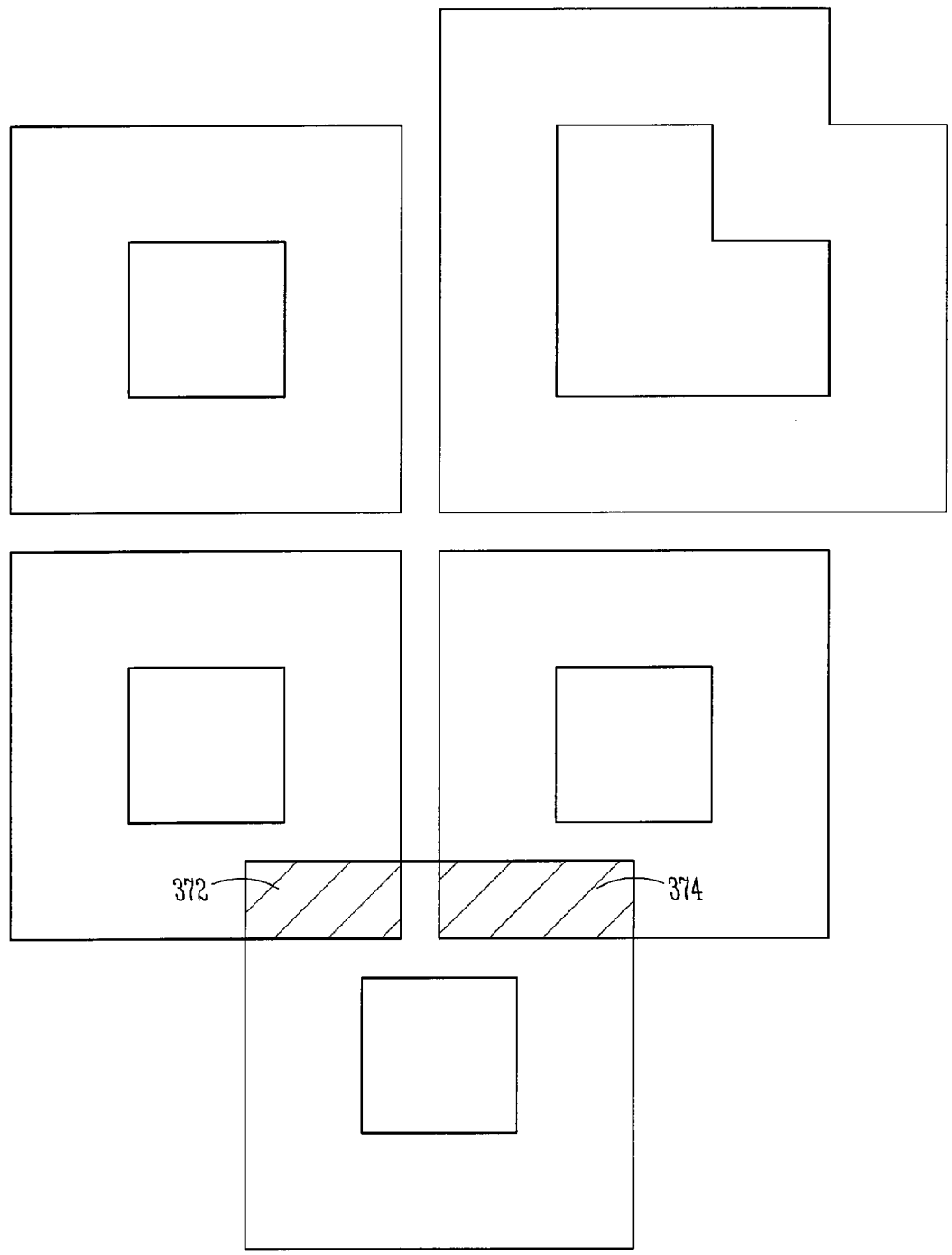
FIG. 3D shows a number of regions according to an embodiment of the invention.

FIG. 3D shows an embodiment that also utilizes the sized up region 312, the sized up region 322, the sized up region 332, the sized up region 342 and the sized up region 352 as shown in FIG. 3B. In FIG. 3D, only overlapping areas of sized up regions are selected for optical simulation analyses. Overlapping areas 372 and 374 are shown shaded in FIG. 3D to indicate their selection for simulation.

Areas 372 and 374 are significantly smaller than the entire reticle area. They are also smaller than the selected regions shown in FIG. 3C. Selection criteria such as FIG. 3C and FIG. 3D are chosen based on the level of prediction detail needed for a given photolithographic system. Simulating fewer regions of a smaller area saves simulation time, while simulating larger selected regions reveals greater detail of potential additional features. One method of selection criteria therefore involves balancing a likelihood of finding additional features in a selected region with selecting a small area that reduces computation time for optical simulation.

Figure 4:
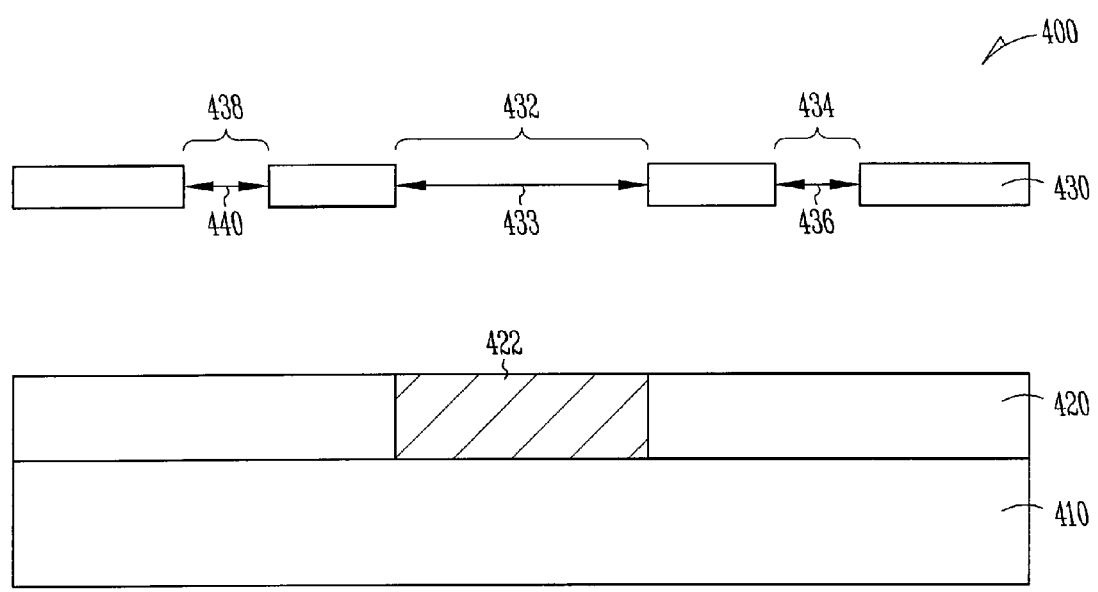
FIG. 4 shows a reticle and substrate according to an embodiment of the invention.

FIG. 4 shows one embodiment of a photolithography system 400. The system 400 includes a substrate 410. In one embodiment, the substrate 410 includes a semiconductor substrate, such as a silicon wafer. Although a semiconductor substrate is discussed for illustration, other working surfaces utilizing photolithography are within the scope of the invention. A resist layer 420 is located over a surface of the substrate 410. A reticle 430 is shown with an aperture 432, and is spaced apart from the resist layer 420 by a focal length. In operation, an energy source is directed towards the resist layer 420, with a portion of the energy source being blocked by the reticle 430. A portion of the energy source contacts the resist layer 420 in a selected region 422. The selected region 422 interacts with the energy source 140 to selectively alter the resist material properties.

FIG. 4 also illustrates a first modifying feature 434 and a second modifying feature 438. In one embodiment, the modifying features include apertures in the reticle 430. FIG. 4 shows the first modifying feature 434 including a first size 436, and the second modifying feature 438 including a second size 440. In one embodiment, the fist size 436 and the second size 440 are sub-printing sizes that allow passage of a portion of the energy source, however, the first modifying feature 434 and the second modifying feature 438 do not form actual features during printing. In one embodiment, the portion of the energy source that passes through the first modifying feature 434 and the second modifying feature 438 interact with the energy passing through the aperture 432 in a manner that eliminates printing of additional features such as those shown in FIG. 2B for example. In one embodiment, the portion of the energy source that passes through the first modifying feature 434 and the second modifying feature 438 causes destructive interference with energy waves that pass through the aperture 432, thus reducing or eliminating additional feature formation during printing. Two modifying features are shown in FIG. 4 as one example. One modifying feature may be included, or several modifying features. In one embodiment, a size, shape, and location of the modifying features is determined using one of the methods of optical simulation as described in embodiments above.

Figure 5A:
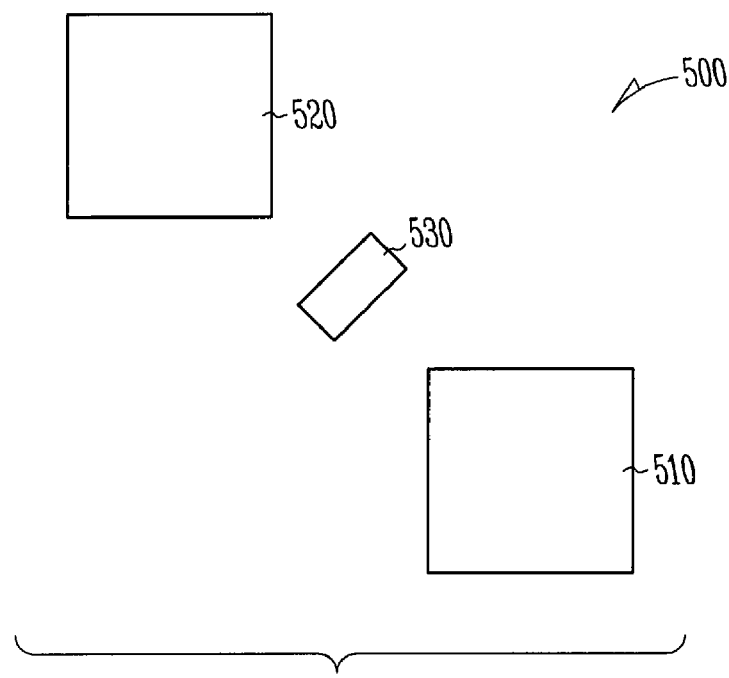
FIG. 5A shows a reticle pattern of features according to an embodiment of the invention.

FIG. 5A shows an example of size, shape, and location of a modifying feature. A reticle pattern of features 500 is shown in FIG. 5A. A first pattern feature 510 is located in proximity to a second pattern feature 520. A modifying feature 530 is shown with one possible size, shape and location between the first pattern feature 510 and the second pattern feature 520. Although a rectangle shaped modifying feature is shown, other geometries are also within the scope of the invention. As discussed above, in one embodiment, the geometry of the modifying feature is determined using optical simulation. Although the modifying feature 530 in FIG. 5A is associated with a pair of features, other modifying features may be associated with a single pattern feature.

Figure 5B:
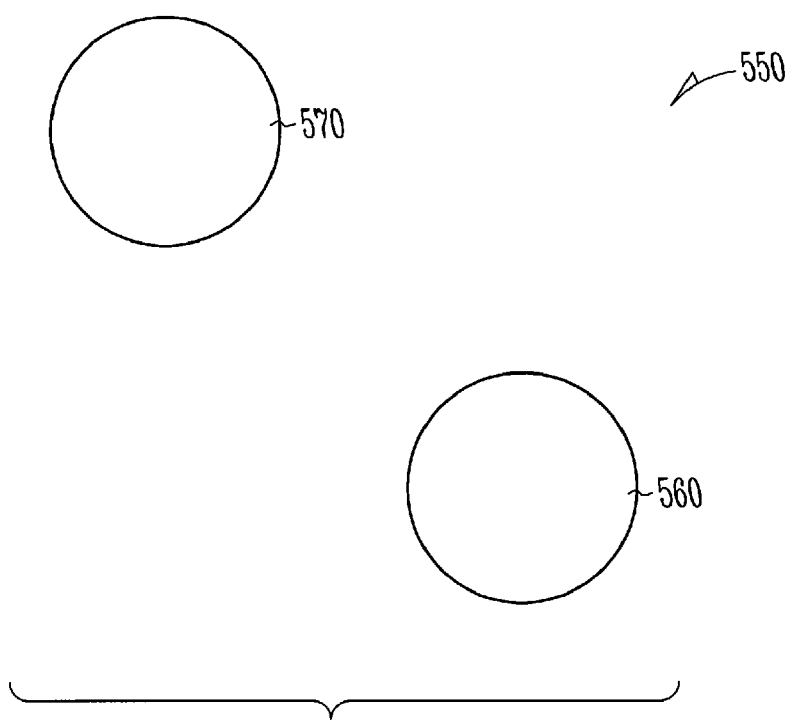
FIG. 5B shows a printed pattern of features from the pattern of FIG. 5A

FIG. 5B shows a printed pattern of features 550 formed from the reticle pattern of features 500 from FIG. 5A. Due to the presence of the modifying feature 530 in the reticle, no additional features have been printed in the printed pattern of features 550. The size, shape, and location of the modifying feature increases the effective suppression of any additional features.

Figure 6:
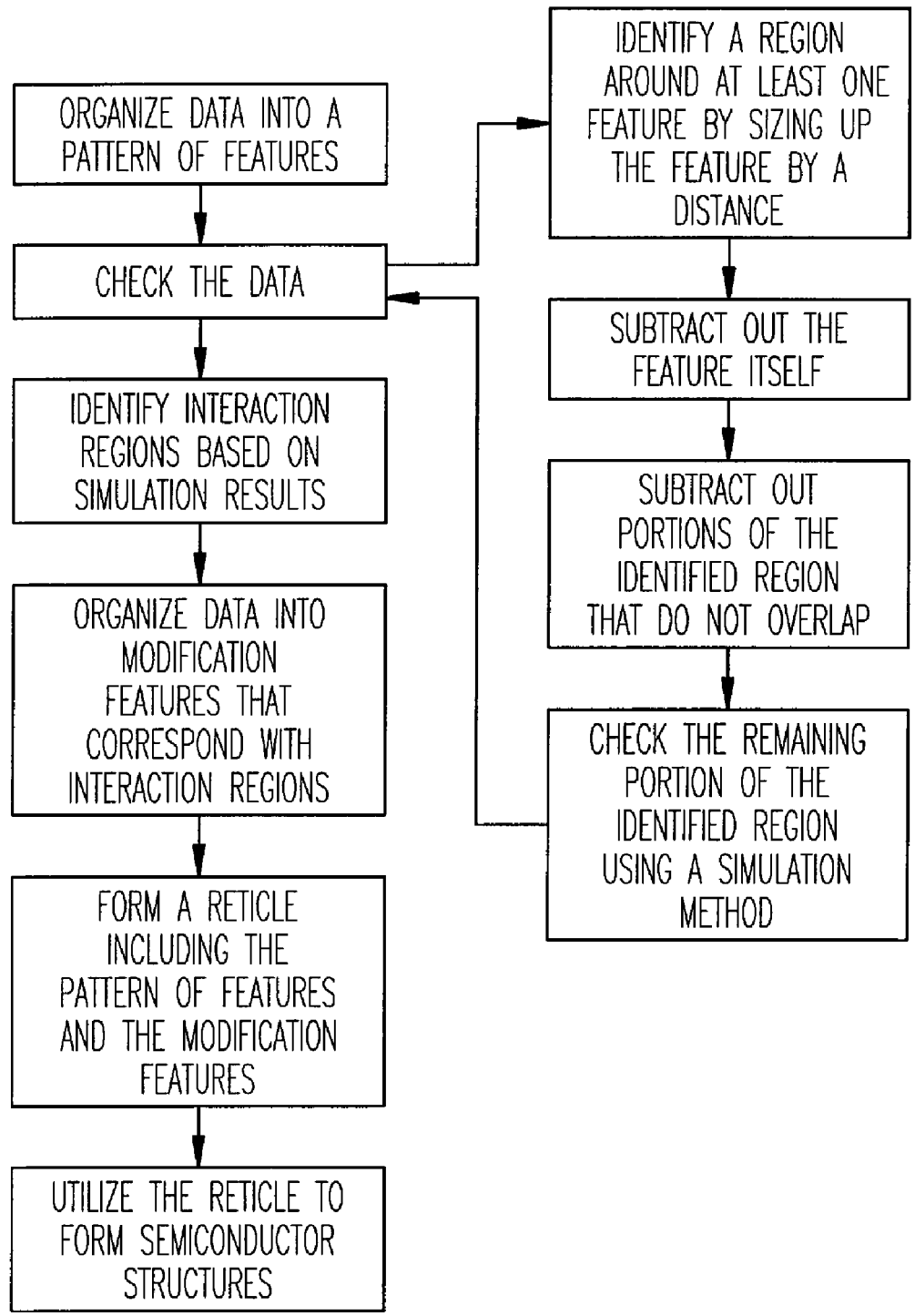
FIG. 6 shows a flow diagram according to one embodiment of the invention.

FIG. 6 shows a flow diagram of one method of checking data using embodiments as described above. The diagram shows organizing data into a pattern of features for a reticle. The data is then checked for possible additional features. A region is identified around at least one feature. In the method shown, the region is identified by sizing up the feature by a given distance. In one embodiment, the feature itself is then subtracted out. In one embodiment, further portions of the regions are subtracted out if they do not overlap. The remaining regions are simulated using an optical simulation software package or similar utility. After checking the data, the results are used to identify portions of the regions where an additional feature is likely to print. In one embodiment, a modifying feature is added to the reticle pattern to suppress or otherwise remove the potential additional feature. In another possible embodiment, instead of adding a modifying feature, the original pattern of elements is re-designed and re-checked to remove the possibility of additional features. After a reticle design has been checked and is in an acceptable condition, a reticle is formed using the organized data for the pattern of features and the modifying features in selected embodiments. In one embodiment, the reticle is further used to form structures or other patterns on a substrate such as semiconductor wafer. Although a specific process flow is shown, the invention is not so limited. For example, other orders of disclosed processes are possible.

Due to the desire to reduce computational time in processes such as reticle design, one embodiment removes the use of optical simulation software altogether. One embodiment is shown below that eliminates the use of optical simulation software in the prediction of unwanted features and placement of modification features to suppress the unwanted features. Although methods described below are used in a photolithographic context, other more general mathematical applications of the following methods are also possible as outlined in the following description.

Figure 7A:
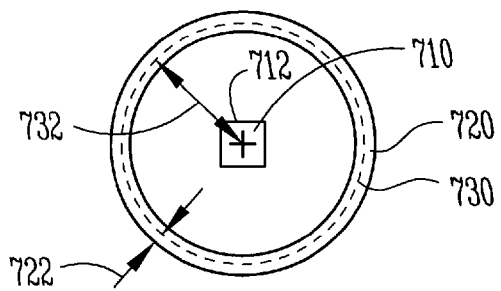
FIG. 7A shows regions and features that are identified according to one embodiment of the invention.

FIG. 7A shows a feature 710 similar to features described in embodiments above for use in a pattern of features. In FIG. 7A, the feature 710 is illustrated as a square, although numerous geometrical forms are possible. The square is used as a convenient example. The feature 710 is not yet printed on a substrate, and is not yet formed into a reticle. The feature 710 is an organization of data in a computer readable medium.

A representation of an equation 730 is shown spaced apart from the feature 710 by a distance 732. In one embodiment, the representation of the equation 730 includes a circle with a radius 732. In such an example, the equation would be:

$$(x-c_x)+(y-c_y)=R^2$$

where $(c_x, c_y)$ is a coordinate for the center of the circle, and R is the radius of the circle In one embodiment, the representation of the equation 730 is defined as the set of points likely to produce an unwanted feature due to optical interactions in a photolithographic system. Although a circle is used as an example, other geometries such as squares, rectangles, or other polygons are also within the scope of the invention. In one embodiment, the representation of the equation 730 is continuous and surrounds the feature 710 although the invention is not so limited. In one embodiment, the representation of the equation 730 is centered over a centroid 712 of the feature 710. In one embodiment, the distance 732 includes a radius that is substantially equal to an optical ambit of the given photolithographic system as described in embodiments above.

A first region 720 is further shown, spaced apart from the feature 710. In one embodiment, the first region 720 defines an area that includes all points of the representation of the equation 730. In one embodiment, the first region 720 includes a circular ring shape having a ring width 722.

Figure 7B:
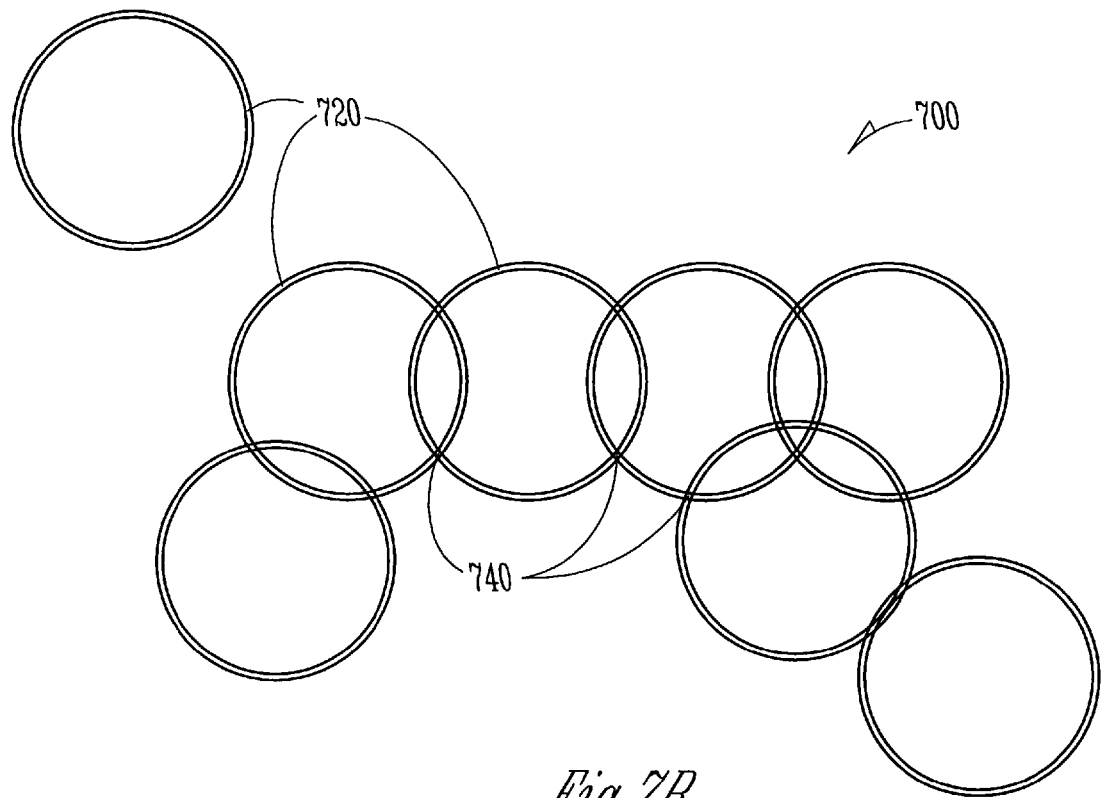
FIG. 7B shows a number of regions that are identified according to one embodiment of the invention.

FIG. 7B shows a pattern 700 that includes a number of first regions 720. In FIG. 7B, each of the first regions 720 includes all points of a number of equations 730 as described above. In this way, the first regions 720 can be thought of as graphical representations of the equations 730. As defined above, any point within the first regions 720 is an approximation of an exact numerical value of points in each equation 730. As a graphical representation of the equations 730, the accuracy of the approximation can be adjusted by varying the ring width 722 of the first regions 720.

A number of intersections 740 are also shown in FIG. 7B. The intersections exist where the first regions 720 overlap, thus defining a graphical intersection area or second region. Because the first regions 720 represent the set of points for each of the equations 730, mathematically, the intersections 740 represent the real solutions to a system of equations represented by the pattern 700.

Figure 7C:
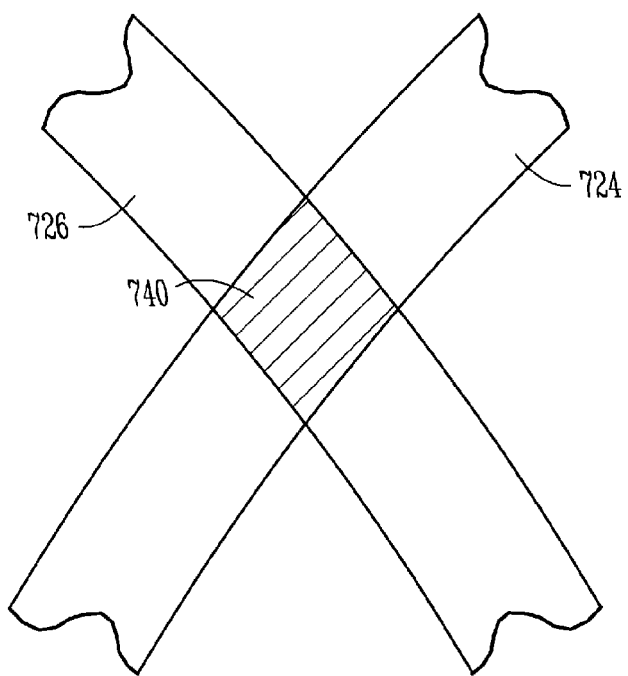
FIG. 7C shows a close up view of an intersecting region of regions according to one embodiment of the invention.

FIG. 7C shows a close up view of two of the first regions included in the number of first regions 720 from FIG. 7B. A first sub-region 724 and a second sub-region 726 are shown intersecting to form a second region at the intersection 740. Because of the graphical nature of the first regions 720, the intersection 740 has an area, in contrast to a point solution that would be obtained if the number of equations 730 were solved mathematically. However, all points within the intersection 740 are a good approximation of the exact solution to the number of equations 730.

Figure 7D:
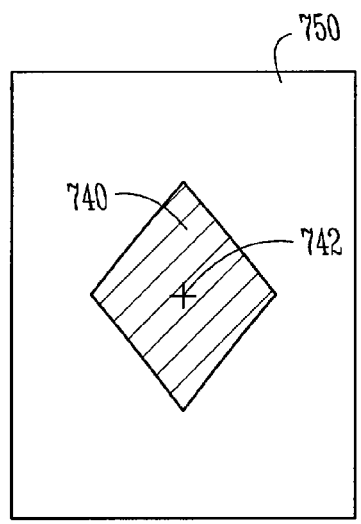
FIG. 7D shows an intersecting region and a modifying feature according to one embodiment of the invention.

FIG. 7D shows a modifying feature 750 located over at least a portion of the intersection 740. In one embodiment, the modifying feature 750 is centered over a centroid 742 of the intersection, although the invention is not so limited. By choosing the centroid of the area of the intersection 740, a highly accurate approximation is made for the exact solution of the system of equations 730 as described above.

Using methods described above, a number of modifying features are located within a pattern of features in a lithographic process. The equations 730 were defined as likely locations for unwanted features due to optical interactions in the photolithographic process, therefore the real solutions to the system of equations 730 yields a good approximation for locations of modifying features to suppress the unwanted features. Using the embodiments shown in FIGS. 7A-7D, locations for modifying features are determined without using optical simulation software, which greatly reduces computation time in fabrication of devices such as reticles.

Further, using the embodiments shown in FIGS. 7A-7D locations for modifying features are determined without using mathematical computational software to determine exact mathematical solutions to a large system of equations. In practice, solving large systems of equations mathematically is also a computationally intensive and time intensive process. By using graphical methods to represent and solve mathematical equations, a large amount of computational resources and time are saved. In one embodiment, a mathematical solution to a system of equations takes 98 hours to obtain a solution. The same system of equations can be solved by using graphical methods to represent and solve the system of equations. In one embodiment, a graphical method using embodiments described above takes 17 hours to solve the system of equations. In one embodiment, the further use of hierarchical graphical software reduces the computational time to 5 hours.

The graphical methods described are explained in the context of locating modifying features in a reticle, however one skilled in the art will appreciate that finding solutions to large systems of equations in a reduced amount of time has many applications outside photolithography. Using the graphical methods described herein, numerous other systems of equations with other applications can be solved quickly as compared to mathematical solution software such as MathCad, MathLab, Mathematica, Derive, etc.

In production, a user may choose to either use optical simulation software as described in embodiments above to achieve high accuracy of placement of modifying features, with reduced computation time for optical simulation as described above. A user may also choose to eliminate optical simulation software altogether as discussed above to obtain the locations of modifying features even faster.

Figure 8A:
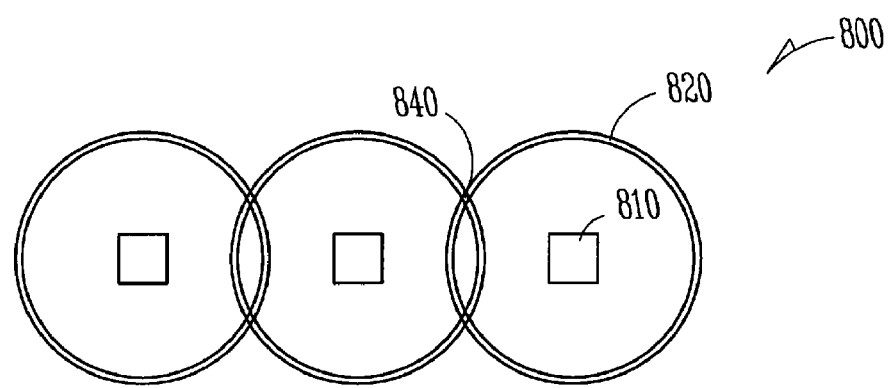
FIG. 8A shows a number of regions and features according to one embodiment of the invention.

FIG. 8A shows a reticle pattern of features 800. The reticle pattern of features shown in FIG. 8A is not yet printed on a substrate, and is not yet formed into a reticle. The reticle pattern 800 is an organization of data in a computer readable medium. A number of first regions 820 as described in FIG. 7A-7D are shown surrounding a number of features 810. A number of intersections 840 as described in FIG. 7A-7D are also shown in FIG. 8A.

Figure 8B:
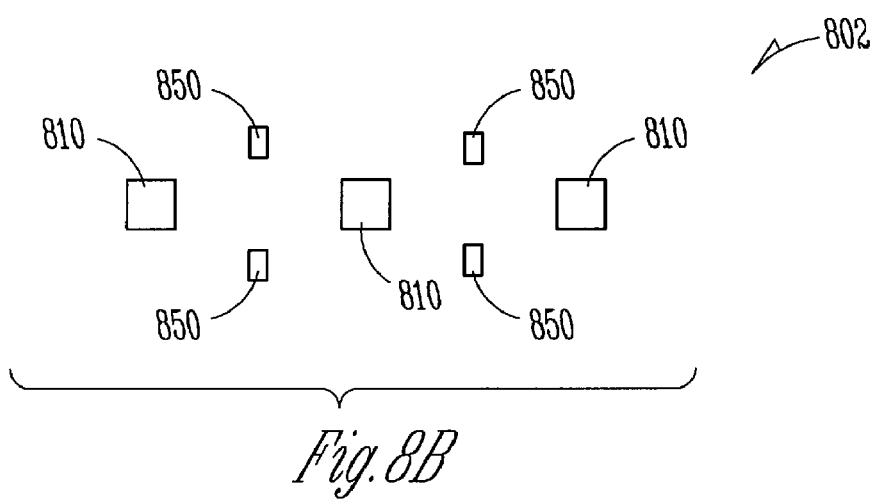
FIG. 8B shows a number reticle features according to one embodiment of the invention.

FIG. 8B shows a reticle 802. The reticle 802 includes the number of features 810. Using methods described above, a number of modifying features 850 are located over locations of at least a portion of the number of intersections 840 as shown in FIG. 8B. The reticle 802 is a tangible device created for a photolithographic manufacturing process. The reticle 802 is formed using the organization of data in the computer readable medium shown in FIG. 8A.

Figure 8C:
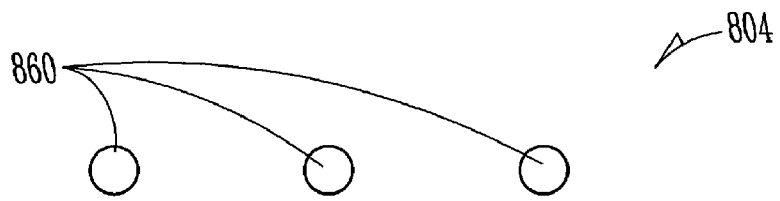
FIG. 8C shows a number of printed features according to one embodiment of the invention.

FIG. 8C shows a pattern of printed features 804 including a number of individual printed regions 860. The pattern of printed features 804 is formed using the reticle 802 as shown in FIG. 8B. As discussed above, optical interactions from features in the reticle 802 produce characteristics in the printed regions 860 such as rounding of the printed regions 860. In one embodiment, as shown in FIG. 8C, the presence of at least one modifying feature 850 suppresses a formation of unwanted features in the pattern of printed features 804. No unwanted features are present in the pattern of printed features 804 of FIG. 8C.

Figure 9:
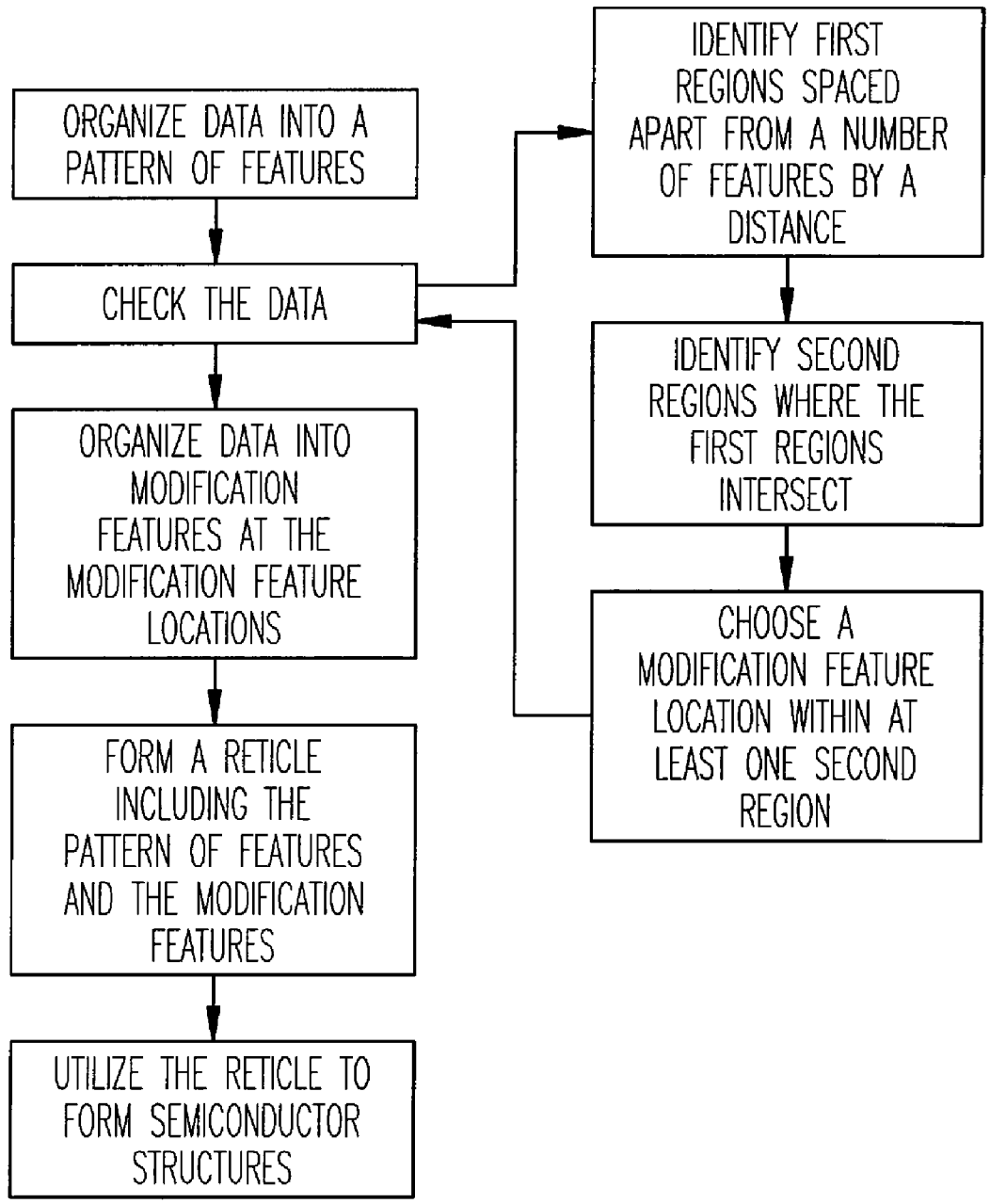
FIG. 9 shows a flow diagram according to one embodiment of the invention.

FIG. 9 shows a flow diagram of one method of checking data using embodiments as described above. The diagram shows organizing data into a pattern of features for a reticle. The data is then checked for possible additional features. A first region is identified that is spaced apart from a number of features by a distance. Second regions are identified by determining where the first regions intersect. A location within the second region such as a centroid is chosen for location of a modifying feature. In one embodiment, a modifying feature is added to the reticle pattern to suppress or otherwise remove the potential additional feature. In another possible embodiment, instead of adding a modifying feature, the original pattern of elements is re-designed and re-checked to remove the possibility of additional features. After a reticle design has been checked and is in an acceptable condition, a reticle is formed using the organized data for the pattern of features and the modifying features in selected embodiments. In one embodiment, the reticle is further used to form structures or other patterns on a substrate such as semiconductor wafer. Although a specific process flow is shown, the invention is not so limited. For example, other orders of disclosed processes are possible.

Figure 10:
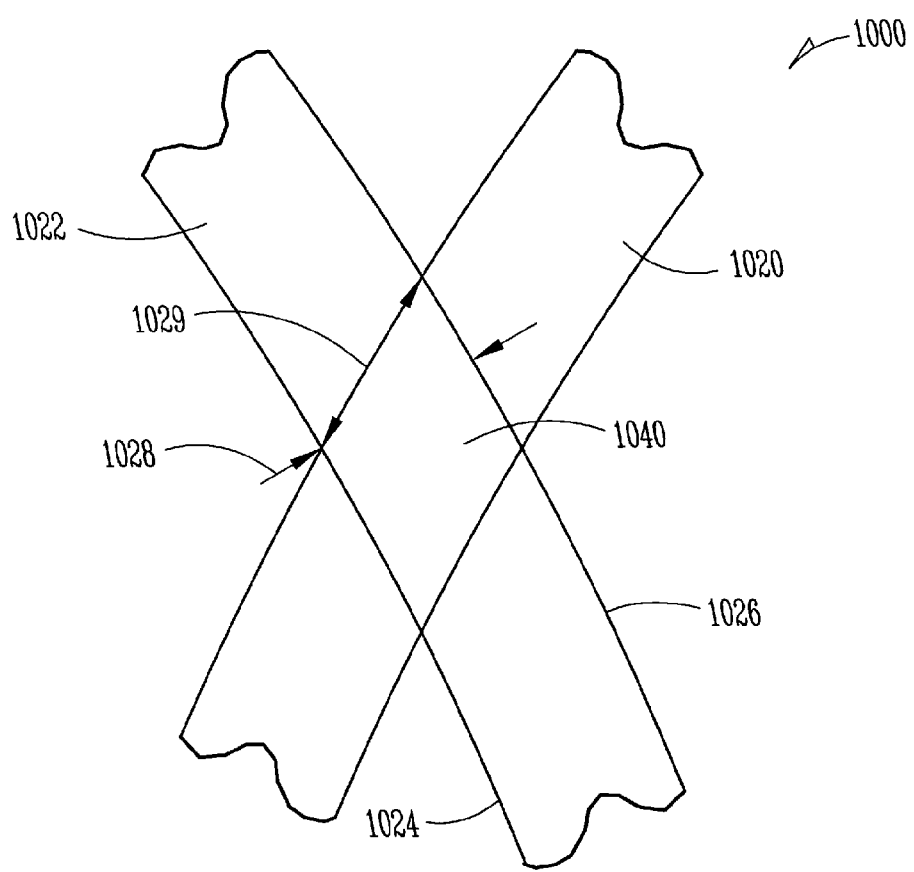
FIG. 10 shows a close up view of an intersection of regions according to one embodiment of the invention.

FIG. 10 shows a close up view of a portion of a pattern 1000, including two first regions as described in embodiments above. A first sub-region 1020 and a second sub-region 1022 are shown intersecting to form a second region 1040 at an intersection of the first sub-region 1020 and the second sub-region 1022. Similar to embodiments described above, the first sub-region 1020 and second sub-region 1022 are graphical representations of equations. As discussed above, graphical techniques, in contrast with mathematical techniques, are shown to be useful in solving systems of equations. In one embodiment, the second region 1040 is identified using a width measurement technique.

A ring width 1028 is shown defined as a distance between an inner boundary 1024 and an outer boundary 1026 measured along a radius of the second sub-region 1022. One second region width 1029 is also shown. As can be seen in FIG. 10, the second region width 1029 is larger than the ring width 1028. In one embodiment, the graphical software is used to determine widths of regions, which enables the graphical software to identify the second regions 1040. The second regions are identified if a width 1029 is measured that is larger than the ring width 1028.

Although a particular second region width 1029 is shown, it should be noted that a number of second regions widths can be measured by the graphical software, and that all possible second region widths as shown in FIG. 10 are greater than the ring width 1028. In one embodiment, the graphical software can therefore measure widths of all regions at random, and the second regions will be correctly identified.

Figure 11:
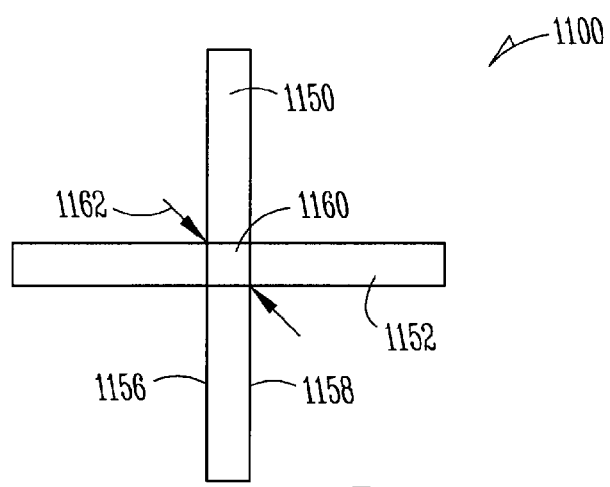
FIG. 11 shows a close up view of another intersection of regions according to one embodiment of the invention.

In one embodiment, the graphical software includes additional instructions for measuring regions that enhance the identification of second regions. FIG. 11 shows a close up view of a portion of a pattern 1100, including two first regions as described in embodiments above. A first sub-region 1150 and a second sub-region 1152 are shown intersecting to form a second region 1160 at an intersection of the first sub-region 1150 and the second sub-region 1152. Similar to embodiments described above, the first sub-region 1150 and second sub-region 1152 are graphical representations of equations.

In one embodiment, the first sub-region 1150 and second sub-region 1152 include parallel linear boundaries such as first boundary 1156 and second boundary 1158. A ring width 1154 is shown between the first boundary 1156 and the second boundary 1158. In one embodiment diagonal distances across vertices of square or diamond shaped second regions are preferentially measured for comparison with the ring width 1028. FIG. 11 shows a diagonal distance 1162 of the second region 1160 that is larger than the ring width 1154, therefore facilitating identification of the second region 1160. Embodiments using preferential measurement such as the example described above enhance the graphical software ability to identify second regions 1160 in special circumstances such as when first sub-regions as shown intersect at substantially right angles.

Figure 12:
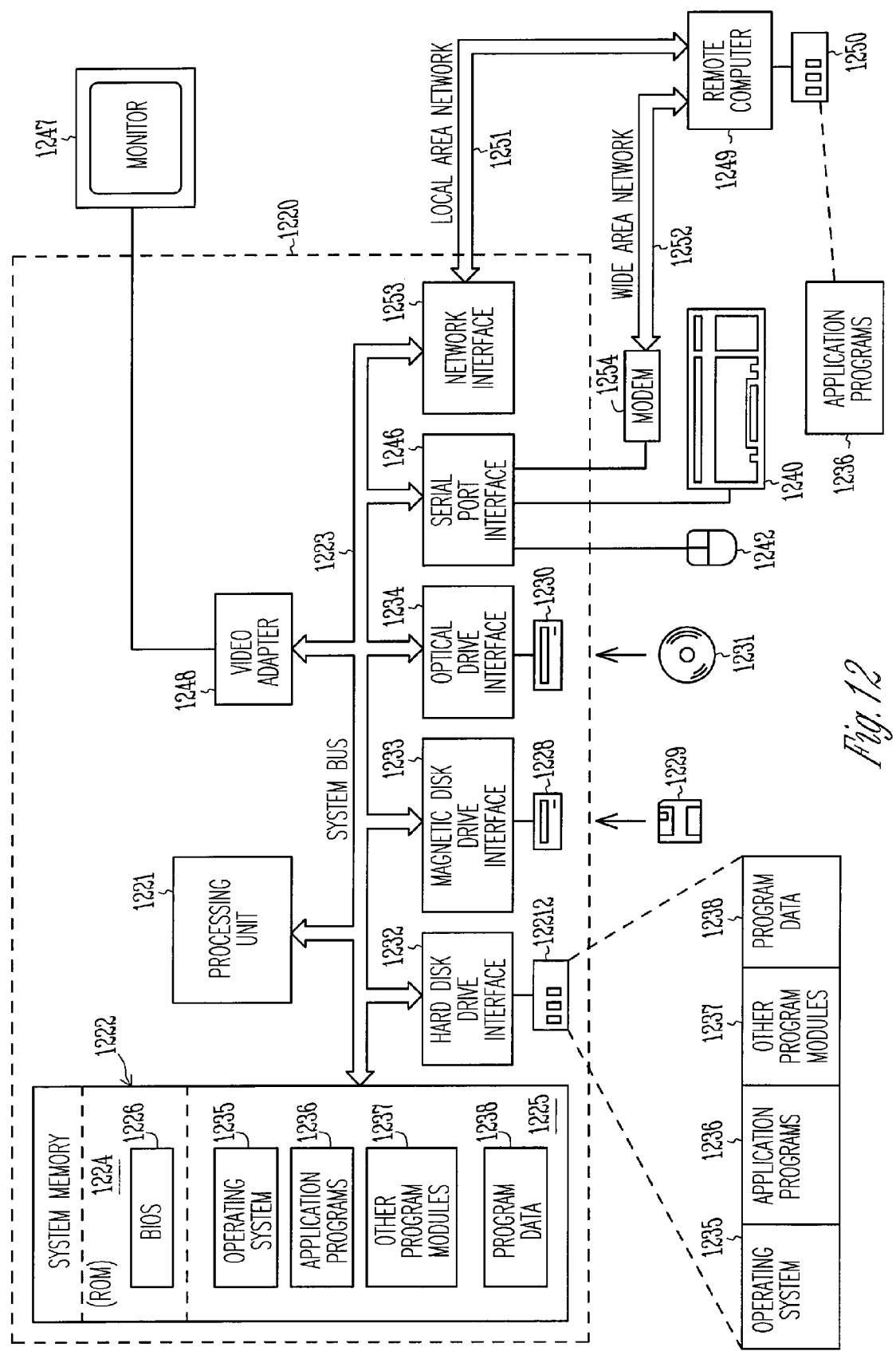
FIG. 12 shows a block diagram of the hardware and operating environment of a suitable computer in conjunction with which embodiments of the invention may be practiced.

FIG. 12 provides a brief, general description of an example of a suitable computing environment in which the above embodiments may be implemented. Embodiments of the invention will hereinafter be described in the general context of computer-executable program modules containing instructions executed by a personal computer (PC). Program modules include routines, programs, objects, components, data structures, etc. that perform particular tasks or implement particular abstract data types. Those skilled in the art will appreciate that the invention may be practiced with other computer-system configurations, including hand-held devices, multiprocessor systems, microprocessor-based programmable consumer electronics, network PCs, minicomputers, mainframe computers, and the like. The invention may also be practiced in distributed computing environments where tasks are performed by remote processing devices linked through a communications network. In a distributed computing environment, program modules may be located in both local and remote memory storage devices.

FIG. 12 shows a general-purpose computing device in the form of a conventional personal computer 1220, which includes processing unit 1221, system memory 1222, and system bus 1223 that couples the system memory and other system components to processing unit 1221. System bus 1223 may be any of several types, including a memory bus or memory controller, a peripheral bus, and a local bus, and may use any of a variety of bus structures. System memory 1222 includes read-only memory (ROM) 1224 and random-access memory (RAM) 1225. A basic input/output system (BIOS) 1226, stored in ROM 1224, contains the basic routines that transfer information between components of personal computer 1220. BIOS 1226 also contains start-up routines for the system. Personal computer 1220 further includes hard disk drive 1227 for reading from and writing to a hard disk (not shown), magnetic disk drive 1228 for reading from and writing to a removable magnetic disk 1229, and optical disk drive 1230 for reading from and writing to a removable optical disk 1231 such as a CD-ROM, DVD or other optical medium. Hard disk drive 1227, magnetic disk drive 1228, and optical disk drive 1230 are connected to system bus 1223 by a hard-disk drive interface 1232, a magnetic-disk drive interface 1233, and an optical-drive interface 1234, respectively. The drives and their associated computer-readable media provide nonvolatile storage of computer-readable instructions, data structures, program modules and other data for personal computer 1220. Although the exemplary environment described herein employs a hard disk, a removable magnetic disk 1229 and a removable optical disk 1231, those skilled in the art will appreciate that other types of computer-readable media which can store data accessible by a computer may also be used in the exemplary operating environment. Such media may include magnetic cassettes, flash-memory cards, digital versatile disks, Bernoulli cartridges, RAMs, ROMs, and the like.

Program modules may be stored on the hard disk, magnetic disk 1229, optical disk 1231, ROM 1224 and RAM 1225. Program modules may include operating system 1235, one or more application programs 1236, other program modules 1237, and program data 1238. A user may enter commands and information into personal computer 1220 through input devices such as a keyboard 1240 and a pointing device 1242. Other input devices (not shown) may include a microphone, joystick, game pad, satellite dish, scanner, or the like. These and other input devices are often connected to the processing unit 1221 through a serial-port interface 1246 coupled to system bus 1223; but they may be connected through other interfaces not shown in FIG. 12, such as a parallel port, a game port, a universal serial bus (USB), IEEE 1394 port, etc. A monitor 1247 or other display device also connects to system bus 1223 via an interface such as a video adapter 1248. In addition to the monitor, personal computers typically include other peripheral output devices (not shown) such as speakers and printers. In one embodiment, one or more speakers 1257 or other audio output transducers are driven by sound adapter 1256 connected to system bus 1223.

Personal computer 1220 may operate in a networked environment using logical connections to one or more remote computers such as remote computer 1249. Remote computer 1249 may be another personal computer, a server, a router, a network PC, a peer device, or other common network node. It typically includes many or all of the components described above in connection with personal computer 1220; however, only a storage device 1250 is illustrated in FIG. 12. The logical connections depicted in FIG. 12 include local-area network (LAN) 1251 and a wide-area network (WAN) 1252. Such networking environments are commonplace in offices, enterprise-wide computer networks, intranets and the Internet.

When placed in a LAN networking environment, PC 1220 connects to local network 1251 through a network interface or adapter 1253. When used in a WAN networking environment such as the Internet, PC 1220 typically includes modem 1254 or other means for establishing communications over network 1252. Modem 1254 may be internal or external to PC 1220, and connects to system bus 1223 via serial-port interface 1246. In a networked environment, program modules, such as those comprising Microsoft® Word which are depicted as residing within PC 1220 or portions thereof may be stored in remote storage device 1250. Of course, the network connections shown are illustrative, and other means of establishing a communications link between the computers may be substituted.

Software may be designed using many different methods, including object oriented programming methods. C++ and Java are two examples of common object oriented computer programming languages that provide functionality associated with object oriented programming. Object oriented programming methods provide a means to encapsulate data members (variables) and member functions (methods) that operate on that data into a single entity called a class. Object oriented programming methods also provide a means to create new classes based on existing classes.

An object is an instance of a class. The data members of an object are attributes that are stored inside the computer memory, and the methods are executable computer code that act upon this data, along with potentially providing other services. The notion of an object is exploited in the present invention in that certain aspects of the invention are implemented as objects in one embodiment.

An interface is a group of related functions that are organized into a named unit. Each interface may be uniquely identified by some identifier. Interfaces have no instantiation, that is, an interface is a definition only without the executable code needed to implement the methods which are specified by the interface. An object may support an interface by providing executable code for the methods specified by the interface. The executable code supplied by the object must comply with the definitions specified by the interface. The object may also provide additional methods. Those skilled in the art will recognize that interfaces are not limited to use in or by an object oriented programming environment.

CONCLUSION

Devices and methods described above include advantages such as the ability to identify sizes, shapes and locations of additional features that occur due to optical interactions as photolithography moves to smaller and smaller scales. In some embodiments, the additional feature information is obtained through use of simulation software that allows a user to find information about additional feature printing before the features are printed, and before the reticle is made. Devices and methods described above further include advantages such as increased speed of simulation. Regions for simulation smaller than the entire reticle pattern are chosen based on factors such as their likelihood to produce additional features. Selected devices and methods described above further eliminate the use of optical simulation software to further decrease processing time. Devices and methods described above therefore can accurately model potential additional features, and correct for them in a shorter amount of time.

Selected embodiments described above show organization of data, and creation of modifying features based on improved simulation techniques that are used to suppress formation of additional features.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of lithography, comprising:
   representing each of a number of equations in a system of equations, each representing a calculated distance from a lithography feature as a graphical area wherein a numerical coordinate solution to each of the equations falls within the respective graphical area;
   identification of at least one intersecting region where the graphical areas overlap; and
   selecting a point within at least one of the intersecting regions that represents a solution to the system of equations;
   positioning an optical modifier in relation to the selected point.

2. The method of claim 1, wherein representing each of the number of equations in the system as a graphical area includes representing a number of circles in the system as a number of rings having a ring width, wherein solutions to the circle fall within the graphical ring.

3. The method of claim 2, wherein the ring width is selected based on a desired accuracy of the solution to the number of equations.

4. The method of claim 2, wherein identification of at least one intersecting region includes checking a width of all graphical areas and identifying regions with a width greater than the ring width.

5. The method of claim 1, wherein selecting a point within at least one of the intersecting regions that represents a solution to the system of equations includes selecting a centroid of at least one of the intersecting regions.

6. A machine readable medium with instructions stored thereon, the instructions when executed, operable to cause:
   graphic representation of a number of equations in a system of equations, each representing a calculated distance from a lithography feature, wherein a numerical coordinate solution to each of the equations falls within a respective graphical area associated with each equation;
   identification of at least one intersecting region where two or more graphical areas overlap;
   selection of a solution within the intersecting region that represents a solution to the system of equations; and
   positioning an optical modifier in relation to the selected solution.

7. The machine readable medium of claim 6, wherein selection of a solution within the intersecting region includes selection of a center of the area of the intersecting region.

8. The machine readable medium of claim 6, wherein graphic representation of a number of equations in a system of equations includes graphic representation of equations representing semiconductor reticle components.

9. A computer implemented method of lithography, comprising:
   representing each of a number of equations in a system of equations, each representing lithography coordinates as a two dimensional collection of pixels in a circular ring, having a ring width, wherein the ring is spaced around a lithography feature wherein all individual equation solutions are included within the collection of pixels;
   identification of at least one intersecting region between two or more collections of pixels that overlap in two dimensions; and
   selecting one pixel from within at least one intersecting region that represents a solution to multiple equations within the system of equations.

10. The method of claim 9, wherein the collection of pixels includes a number of pixels large enough to represent an amount of acceptable accuracy in the solution to the system of equations.

11. The method of claim 9, wherein selecting one pixel from within at least one intersecting region includes selecting a centroid of the intersecting region.

12. The method of claim 9, wherein selecting one pixel from within at least one intersecting region includes selecting a center of the area of the intersecting region.

13. The method of claim 9, wherein representing each of a number of equations includes representing each of a number of optical simulation equations.

14. A computer implemented method of lithography, comprising:
   plotting a solution to each individual equation in a system of equations, each equation representing a calculated distance from a lithography feature, with an additional two dimensional area surrounding the plotted solution by an adjusted amount to form a graphical area;
   identification of at least one intersecting region where the graphical areas overlap; and
   selecting a more specific solution determined by at least one of the intersecting regions that represents a solution to the system of equations.

15. The method of claim 14, wherein selecting a point within at least one of the intersecting regions that represents a solution to the system of equations includes selecting a centroid of at least one of the intersecting regions.

16. The method of claim 14, wherein selecting one pixel from within at least one intersecting region includes selecting a center of the area of the intersecting region.

17. The method of claim 14, wherein selecting a more specific solution includes selecting a more specific area within at least one of the intersection regions.

18. The method of claim 14, wherein selecting a more specific solution includes selecting a point determined by the intersecting region.

19. The method of claim 18, wherein the point is located at a centroid of the intersecting region.

20. The method of claim 19, wherein the point is located within the intersecting region.

* * * * *